United States Patent
Thompson et al.

(10) Patent No.: US 9,593,008 B2
(45) Date of Patent: Mar. 14, 2017

(54) MEMS SENSOR INCLUDING AN OVER-TRAVEL STOP AND METHOD OF MANUFACTURE

(71) Applicant: InvenSense, Inc., San Jose, CA (US)

(72) Inventors: Matthew Julian Thompson, Beaverton, OR (US); Michael Dueweke, Campbell, CA (US); Ilya Gurin, Mountain View, CA (US); Joseph Seeger, Menlo Park, CA (US)

(73) Assignee: InvenSense, Inc., San Jose, CA (US)

( * ) Notice: Subject to any disclaimer, the term of this patent is extended or adjusted under 35 U.S.C. 154(b) by 340 days.

(21) Appl. No.: 14/501,792

(22) Filed: Sep. 30, 2014

(65) Prior Publication Data

US 2016/0094156 A1 Mar. 31, 2016

(51) Int. Cl.
*H02N 1/04* (2006.01)
*B81B 3/00* (2006.01)
*H02N 11/00* (2006.01)
*B81B 7/02* (2006.01)

(52) U.S. Cl.
CPC .............. *B81B 3/0051* (2013.01); *B81B 7/02* (2013.01); *B81B 2203/0118* (2013.01); *H02N 11/002* (2013.01)

(58) Field of Classification Search
CPC ................................ H02N 11/002; B81B 7/02

USPC .......................................................... 310/300
See application file for complete search history.

(56) References Cited

U.S. PATENT DOCUMENTS

| | | | | |
|---|---|---|---|---|
| 6,914,711 B2* | 7/2005 | Novotny | ............ | G02B 26/0841 359/224.1 |
| 7,986,073 B2 | 7/2011 | Godil | | |
| 2010/0242603 A1* | 9/2010 | Miller | ....................... | B81B 7/02 73/514.32 |
| 2011/0102871 A1* | 5/2011 | Godil | ................. | G02B 26/0841 359/200.6 |
| 2011/0126632 A1* | 6/2011 | McNeil | ..................... | B81B 7/02 73/718 |
| 2014/0167189 A1* | 6/2014 | Steimle | ................. | B81B 3/0005 257/415 |
| 2014/0268482 A1* | 9/2014 | DeReus | .................. | B81B 3/001 361/290 |

* cited by examiner

*Primary Examiner* — Hanh Nguyen

(57) ABSTRACT

A MEMS sensor is disclosed. The MEMS sensor includes a MEMS structure and a substrate coupled to the MEMS structure. The substrate includes a layer of metal and a layer of dielectric material. The MEMS structure moves in response to an excitation. A first over-travel stop is formed on the substrate at a first distance from the MEMS structure. A second over-travel stop on the substrate at a second distance from the MEMS structure. At least one electrode on the substrate at a third distance from the MEMS structure. The first, second and third distances are all different.

14 Claims, 7 Drawing Sheets

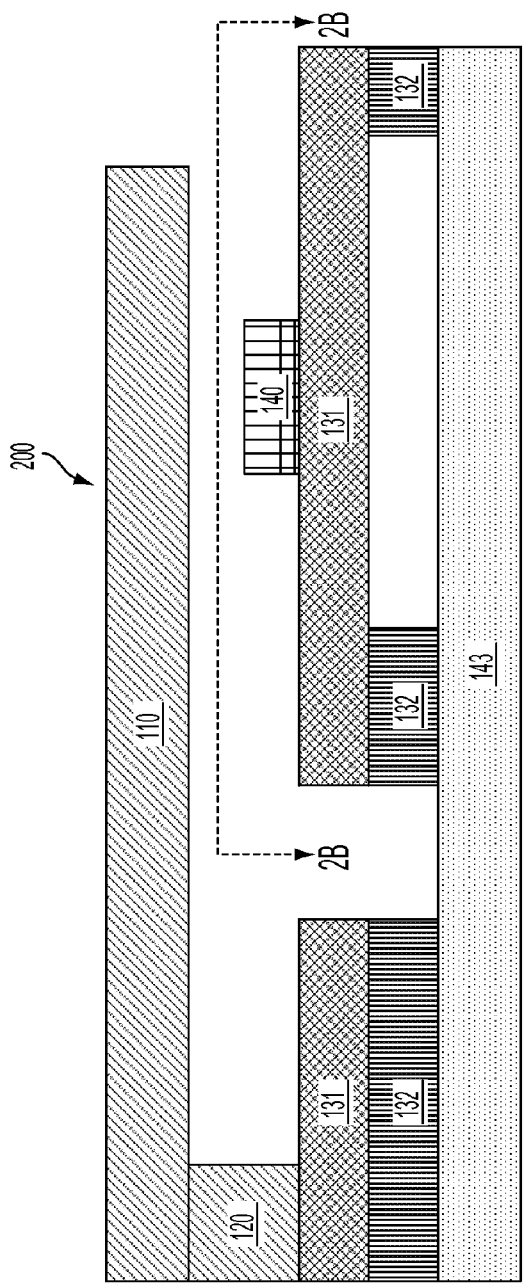
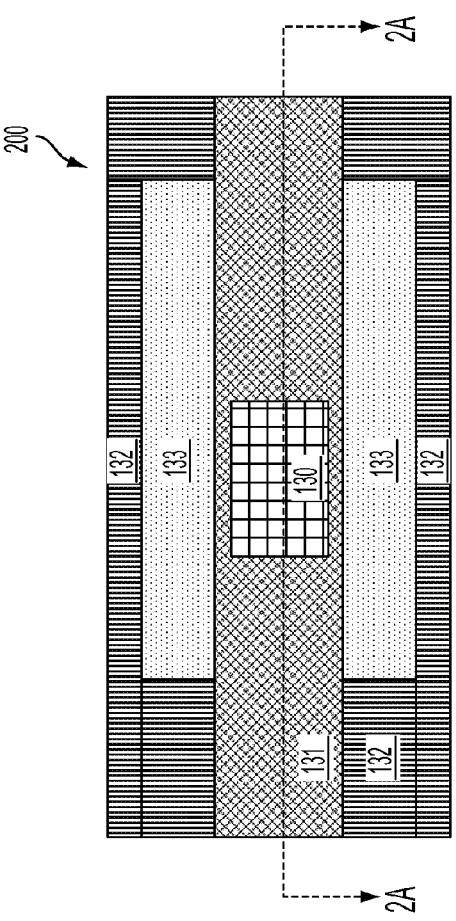
FIG. 2A
FIG. 2B

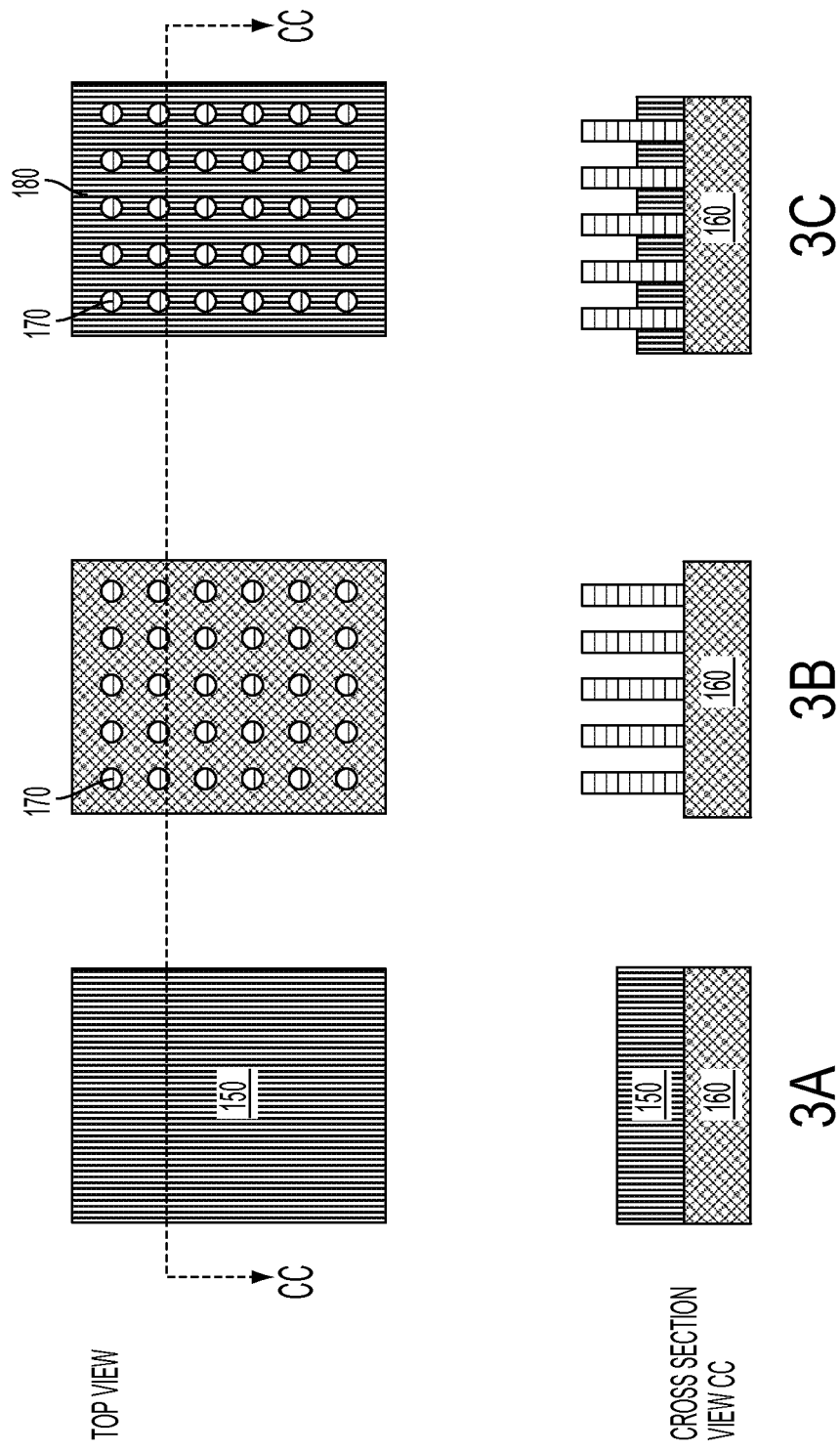

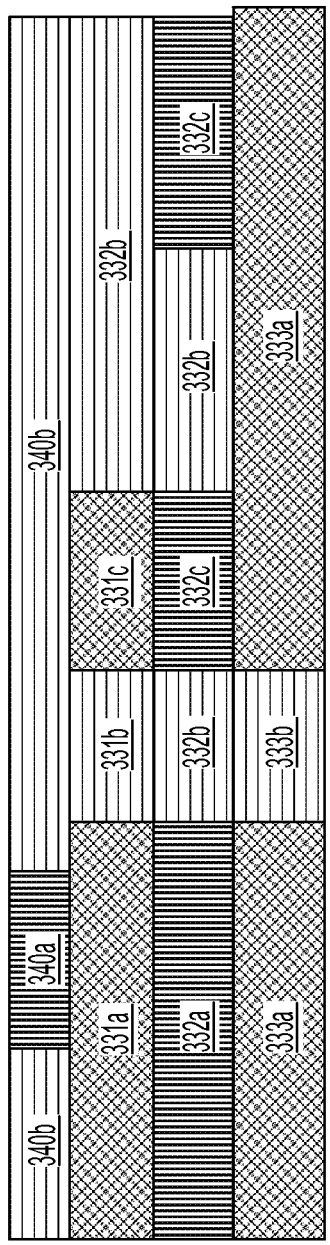
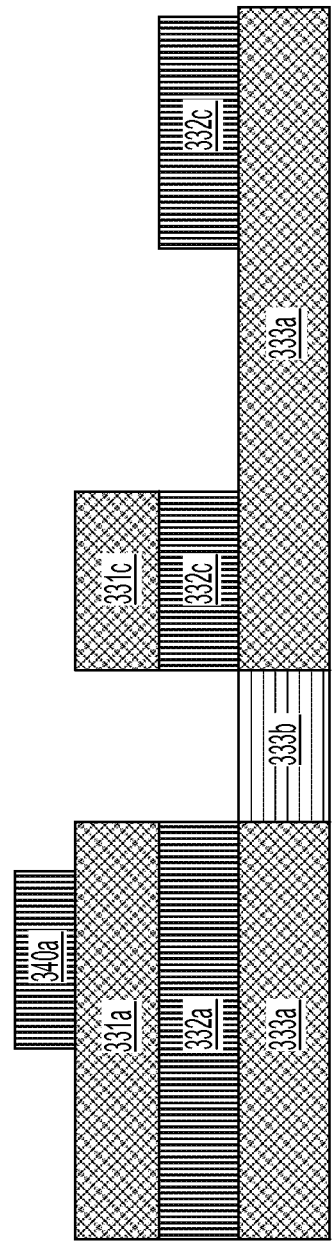
FIG. 4A
FIG. 4B

MEMS SENSOR INCLUDING AN OVER-TRAVEL STOP AND METHOD OF MANUFACTURE

FIELD OF THE INVENTION

The present invention relates generally to Microelectromechanical systems (MEMS) devices and more particularly to minimizing stiction on such devices.

BACKGROUND

MEMS devices are utilized in a variety of environments. Under shock conditions MEMS devices will travel beyond normal operating range and for a MEMS element mounted on a substrate, the MEMS element may contact the substrate. The substrate could be a complementary metal-oxide-semiconductor (CMOS) substrate. Over-travel stops are typically formed on the uppermost base layer to prevent damage to sensitive electrodes during large shock. However under low shock conditions the MEMS element can get stuck on an over-travel stop rendering the MEMS inoperable. This failure is commonly referred to as stiction.

Conventionally over-travel stops are made from non-conductive materials, such as silicon nitride ($Si_xN_y$) and silicon dioxide ($SiO_2$). Over-travel stops made of non-conductive materials can charge during operation creating an undesirable electrostatic force on a MEMS element leading to offset. There is a need to provide systems that overcome charge induced offset while preventing damage under large shock and preventing stiction under low shock conditions. The present invention addresses such a need.

SUMMARY

A MEMS sensor is disclosed. The MEMS sensor includes a MEMS structure and a substrate coupled to the MEMS structure. The substrate includes a conductive and dielectric material. The MEMS structure moves in response to an excitation. A first over-travel stop is formed on the substrate at a first distance from the MEMS structure. A second over-travel stop is formed on the substrate at a second distance from the MEMS structure. At least one electrode on the substrate at a third distance from the MEMS structure. The first, second and third distances are all different.

A method for fabricating a MEMS device is disclosed. The method includes providing a MEMS structure and providing a substrate. The substrate is comprised of patterned conductive and dielectric material. The method removes portions of the dielectric material to provide at least two over-travel stops within the substrate and at least one electrode. The method bonds the MEMS structure to the substrate. The at least two over-travel stops and the at least one electrode have different distances to the MEMS structure.

A system and method in accordance with the present invention provides for different formations of over-travel stops using common materials, like those used in CMOS, and masks for MEMS structures on base sensors and other types of actuators for improved performance. By having at least one over-travel stop within the MEMS device being of conductive material stiction is minimized charge induced offset.

BRIEF DESCRIPTION OF THE DRAWINGS

FIG. 2A-2B is a diagram that shows a cross-section and top view of a second embodiment of a MEMS device in accordance with the present invention.

FIGS. 3A-3C are diagrams that show a first embodiment of over-travel stop structure in accordance with the present invention.

FIGS. 4A-4C are diagrams that show a second embodiment of a fabrication method for over-travel stops in accordance with the present invention.

DETAILED DESCRIPTION

Figure 1:
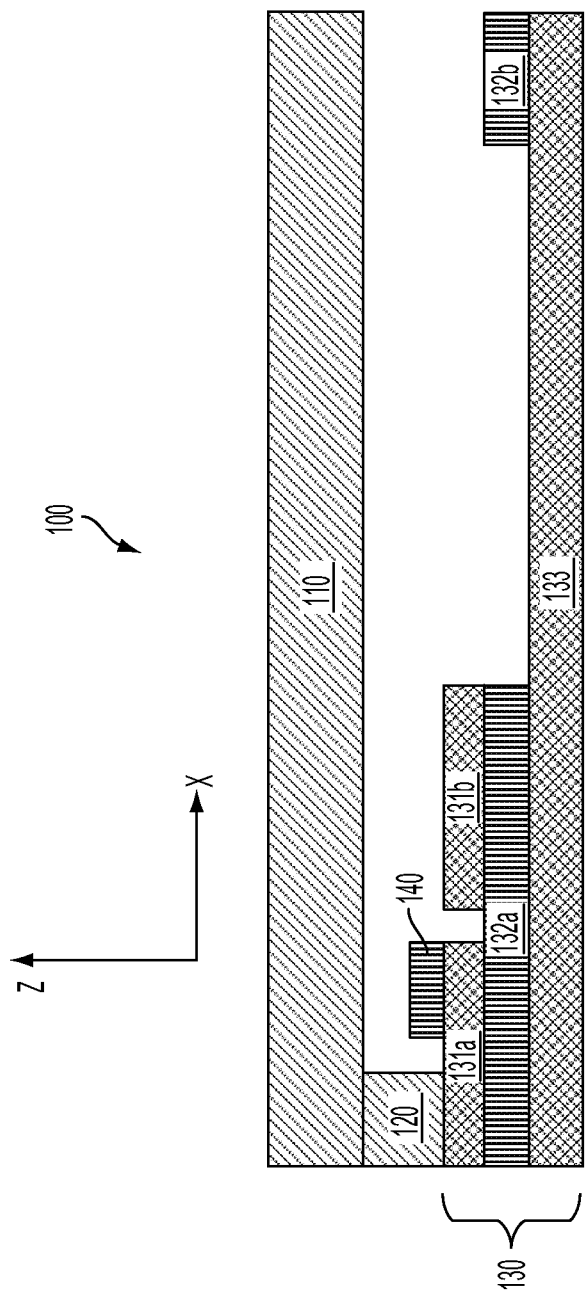
FIG. 1 is a diagram that shows a first embodiment of a MEMS device in accordance with the present invention.

The present invention relates generally to MEMS devices and more particularly to minimizing stiction of such devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In the described embodiments micro-electro-mechanical systems (MEMS) refers to a class of structures or devices fabricated using semiconductor-like processes and exhibiting mechanical characteristics such as the ability to move or deform. In the described embodiments, the MEMS device may refer to a semiconductor device implemented as a micro-electro-mechanical system. The MEMS structure may refer to any feature that may be part of a larger MEMS device. MEMS devices often, but not always, interact with electrical signals. MEMS devices include but are not limited to gyroscopes, accelerometers, barometers, magnetometers, pressure sensors, microphones, speakers and radio-frequency components. Silicon wafers containing MEMS structures are referred to as MEMS wafers.

A structural layer may refer to the silicon layer with moveable structures. An engineered silicon-on-insulator (ESOI) wafer may refer to an SOI wafer with cavities beneath the silicon structural layer. A cap wafer typically refers to a thicker substrate used as a carrier for the thinner silicon device substrate in a silicon-on-insulator wafer.

A MEMS substrate provides mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. A cap or a cover provides mechanical protection to the structural layer and optionally forms a portion of the enclosure. Standoff defines the vertical clearance between the structural MEMS layer and the IC substrate. Standoff may also provide electrical contact between the MEMS structural layer and the IC substrate.

Standoff may also provide a seal that defines an enclosure. Integrated Circuit (IC) substrate may refer to a silicon substrate with electrical circuits, typically CMOS circuits. A cavity may refer to a recess in a substrate. Chip includes at least one substrate typically formed from a semiconductor material. A single chip may be formed from multiple substrates, where the substrates are mechanically bonded together. Multiple chip includes at least 2 substrates, wherein the 2 substrates are electrically connected, but do not require mechanical bonding.

In an embodiment the base layer is a CMOS wafer. A system and method in accordance with the present invention provides for different formations of over-travel stops using existing CMOS materials and masks for MEMS structures on CMOS sensors and other types of actuators for improved performance. CMOS comprises interleaved metal layers, interlayer dielectric, passivation layer and transistor layer. CMOS metal layers contain a conductor like aluminum, copper or similar and a dielectric like $SiO_x$. CMOS interlayer dielectric (ILD) contains a conductor like tungsten and a dielectric like SiOx. Both the metal and the dielectric layers contain a conductor metal and a dielectric material.

FIG. 1 is a diagram that shows a first embodiment of a MEMS device 100 in accordance with the present invention. MEMS device 100 includes a first substrate 130 that is connected to a second substrate 110 via an anchor 120. In an embodiment the first substrate 130 comprises a substrate and the second substrate 110 comprises a MEMS substrate. A first over-travel stop 140 is formed on the top of the substrate 130 and has a first distance between the MEMS substrate 110 and over-travel stop 140. A second over-travel stop 132b is formed in the substrate 130 and has a second distance between the MEMS substrate 110 and the second over-travel stop 132b. A first electrode 131b is formed in the substrate 130 and has a third distance between the MEMS substrate 110 and electrode 131b. In an embodiment, the first, second and third distances are all different distances.

If the MEMS substrate 110, of MEMS device 100, rotates about anchor 120 under normal operation it is advantageous to have the over-travel stop 132b located at a larger radius with a larger distance. In doing so the full travel of the MEMS substrate 110 is increased thereby reducing stiction and improving robustness to over-travel excitations. Therefore it is advantageous for the second distance of over-travel stop 132b be larger than the first distance of over-travel stop 140.

Under low z-axis shock the MEMS device 100 will cause MEMS substrate 110 to rotate clockwise about anchor 120 causing the substrate 110 to contact over-travel stop 132b thereby preventing contact of the MEMS substrate 110 to the electrode 131b.

MEMS device 100 under large z-axis shock will cause MEMS substrate 110 to translate in a –z direction causing it to first contact over-travel stop 140 preventing contact of MEMS substrate 110 to electrode 131b.

Since different shock levels cause different motions of the MEMS substrate 110 two different over-travel stops is preferred. To decrease stiction, caused from a low level shock, the second distance of over-travel stop 132b is larger than the first distance of over-travel stop 140. Since the second distance is larger more z-axis acceleration is required before the over-travel stop comes into contact and therefore the MEMS substrate 110 has a larger reaction force pulling away from the second over-travel stop 132b reducing stiction. Over-travel stop 140 and 132b both prevent the MEMS substrate 110 contacting electrode 131b however; over-travel stop 132b has a larger distance than over-travel stop 140 to prevent stiction under low shock conditions.

In an embodiment, the substrate 130 includes a plurality of layers. Interlayer dielectric (ILD) layer 132 is interleaved with metal layers 131 and 133. In an embodiment, over-travel stop 140 is formed on the top of substrate 130 using a passivation layer. In another embodiment, over-travel stop 140 is formed in an ILD layer above the top metal layer 131. In an embodiment, the over-travel stops 140 comprise one or more conductive layers for example tungsten, titanium nitride, and/or aluminum through the utilization of a mask in a CMOS process.

In an embodiment, over-travel stops 140 are made of tungsten which may be preferred over SiN and $SiO_2$ as tungsten has a greater elastic modulus preventing damage and is electrically conductive so that it can not store charge creating electrostatic offset, thereby improving the performance of the MEMS device 100.

In an embodiment, the over-travel stops 132b is composed of tungsten and is preferred over SiN and $SiO_2$ as tungsten has a greater elastic modulus preventing damage and is electrically conductive so that it can not store charge creating electrostatic offset, thereby improving the performance of the MEMS device 100.

FIGS. 2A and 2B are diagrams that show a side view and a sectional top view of a second embodiment of an MEMS device 200 in accordance with the present invention. MEMS device 200 is similar to MEMS device 100 but the over-travel stop is flexible. The flexible over-travel stop is constructed using portions of three layers, 140, 131 and 132 as shown in FIG. 2A. Layer 131 in the over-travel stop is a flexible element that provides the flexibility for the over-travel stop as shown in FIG. 2B. A flexible over-travel stop provides energy storage and dissipation upon a shock condition making the device more robust to shock conditions.

FIG. 3A-C shows the construction of an over-travel stop. This can be any of over-travel stop 140 and 132b of MEMS device 100 or 140 from MEMS device 200. In FIG. 3A an over-travel stop 150 is formed on surface 160. In a first embodiment the over-travel stop 150 is a block of conductive material for example tungsten, titanium nitride, and/or aluminum. In a second embodiment the over-travel stop 150 is a block of non-conductive material for example SiN and/or $SiO_x$.

FIG. 3B is an embodiment of the construction of an over-travel stop. This can be any over-travel stop 140 and 132b of MEMS device 100 or over-travel stop 140 from MEMS device 200. Over-travel stop 170 is formed on the surface of layer 160 and comprises a group of smaller over-travel stops. In an embodiment, over-travel stop 170 is constructed from a conductive material for example Tungsten vias. In another embodiment, over-travel stop 170 is constructed from a patterned conductive material, for example a tungsten layer in the base ILD, and can form any shape.

FIG. 3C is another embodiment of the construction of an over-travel stop. This can be any over-travel stop 140 and over-travel stop 132b of MEMS device 100 or over-travel stop 140 from MEMS device 100. Over-travel stop 170 is formed on the surface of layer 160 and comprises a group of smaller over-travel stops and binding layer 180. Binding layer 180 improves the robustness of the over-travel stop. In an embodiment, over-travel stop 170 is constructed from conductive material and the binding layer 180 is a dielectric. In another embodiment, over-travel stop 170 is constructed from the base ILD layer using tungsten vias as the conductive material and $SiO_x$ as the dielectric. In another embodiment, over-travel stop 170 is constructed from the base ILD layer using patterned tungsten as the conductive material and $SiO_x$ as the dielectric.

Over-travel stops can be fabricated in a variety of processes and those processes would be within the spirit and scope of the present invention. One advantage of the use of the conductive over-travel stop in accordance with an embodiment is that the stops are easily fabricated using existing CMOS fabrication methods. To describe the advantages in more detail refer now to the following discussion in conjunction with the accompanying Figures.

Figure 4C:
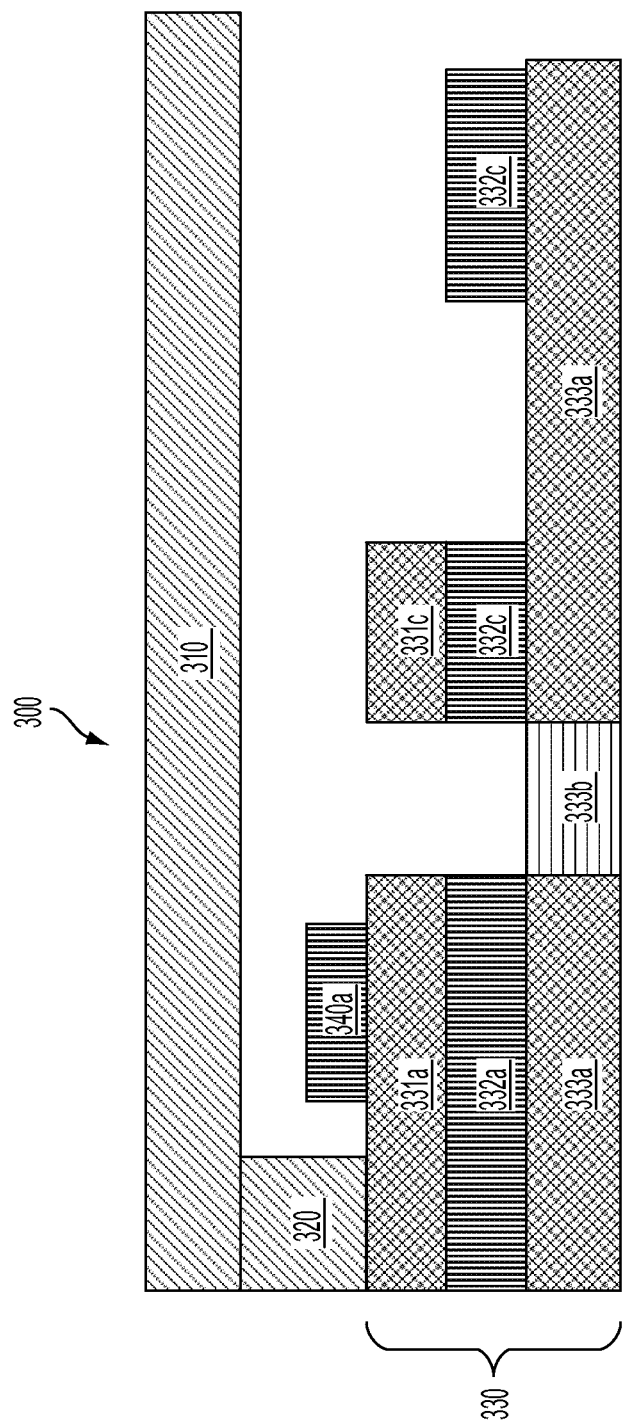

FIGS. 4A-4C are diagrams that show a first embodiment of a fabrication method for over-travel stops in accordance with the present invention. A wafer is shown in FIG. 4A containing dielectric material 340*b*, 331*b*, 332*b*, and 333*b*. The wafer is shown in FIG. 4A also containing conductive material 331*a*, 332*a*, 332*a*, 331 *c*, 332*c* and 333*c*. In an embodiment 340*a* is a passivation layer. In another embodiment 340*a* is a dielectric material. In another embodiment 340*a* is a conductive material. In an embodiment the wafer is a CMOS wafer. Thereafter, the portions of dielectric 340*b*, 331 *b* and 332*b* are removed to provide the first electrode 331*c* and over-travel stops 340*a* and 332*c* for example by using a timed dry etch, as shown in FIG. 3B. Finally, the MEMS substrate 310 and MEMS anchor 320 is bonded to the substrate 330 to form MEMS device 300, as shown in FIG. 4C. The distance between the MEMS 310 and the two over-travel stops, 340*a* and 332*c*, and the electrode 331*c* are all different.

Figure 5A:
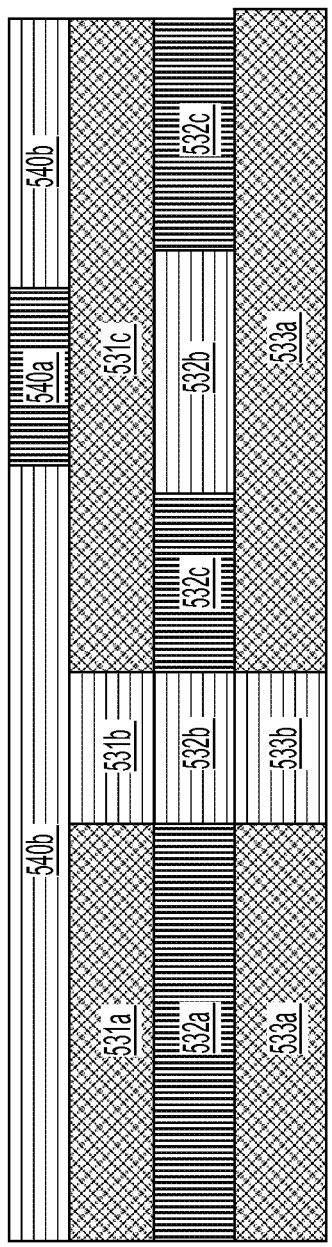
FIGS. 5A-5C are diagrams that show a third embodiment of a fabrication method for over-travel stops in accordance with the present invention.
Figure 5B:
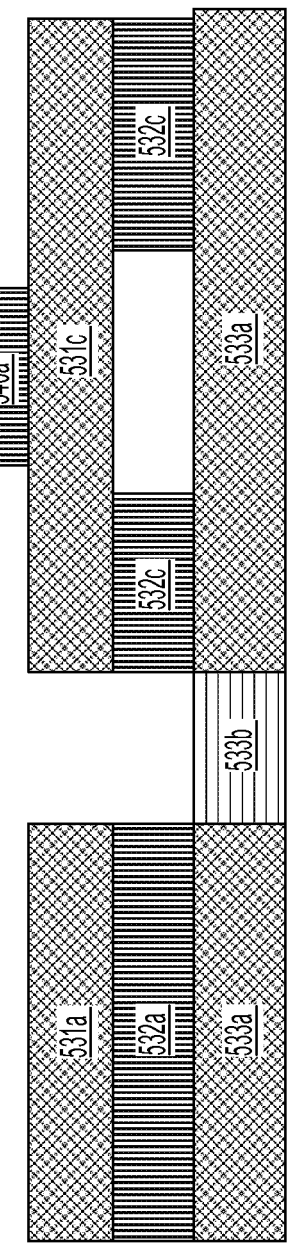
Figure 5C:
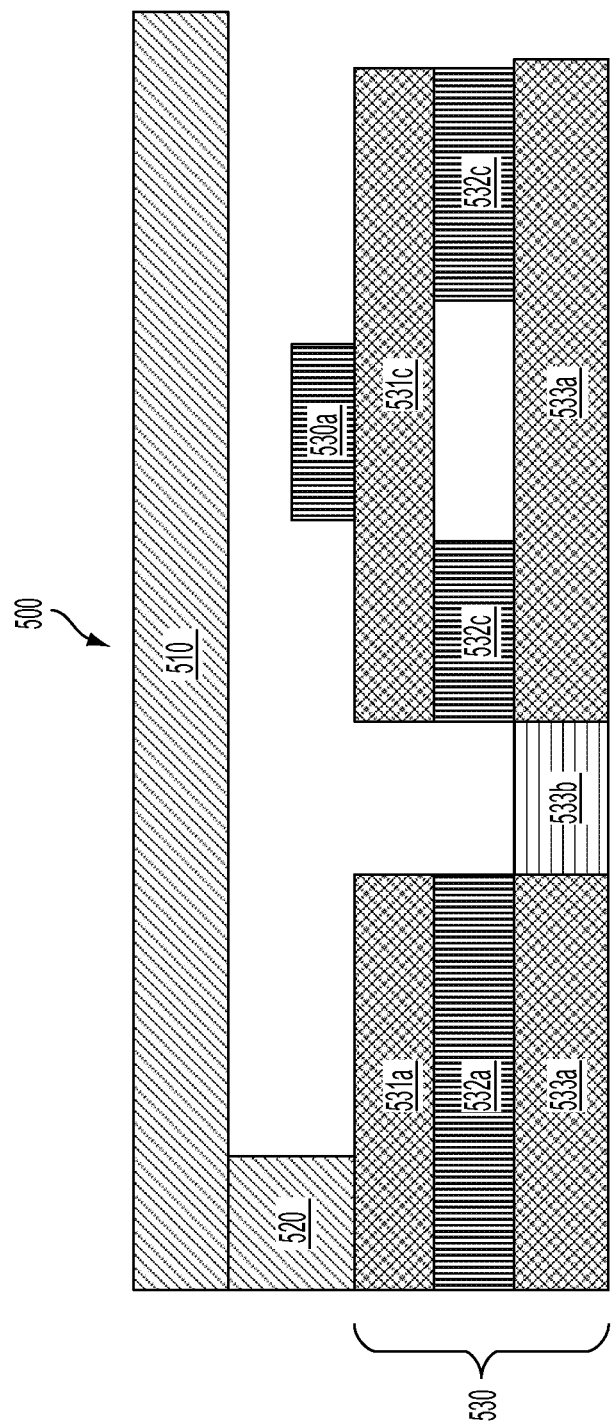

FIGS. 5A-5C are diagrams that show a second embodiment of a fabrication method for over-travel stops in accordance with the present invention. A wafer is provided, as shown in FIG. 5A, comprising dielectric material 540*b*, 531*b* 532*b*, and 533*b*. The wafer also comprises conductive material, 531*a*, 532*a*, 533*a*, 531*c* and 532*c*. In an embodiment layer 540*a* is a dielectric material. In another embodiment layer 540*b* is a conductive material. In an embodiment the wafer is a CMOS wafer. Thereafter, portions of the dielectric 540*b*, 531 *b* and 532*b* is removed to form a flexible over-travel stop 540*a*, for example by using a wet etch, as shown in FIG. 5B. Finally, the MEMS substrate 510 is then bonded to the substrate 530 to form MEMS device 500, as shown in FIG. 5C.

A system and method in accordance with the present invention provides for different formations of over-travel stops using existing base material and masks for MEMS structures on base sensors and other types of actuators for improved performance. By having at least one over-travel stop within the MEMS device being of only conductive material stiction is minimized and undesirable charge build up of the device is also minimized.

It will be appreciated in the described embodiments that a MEMS substrate and a substrate can be bonded using Al—Ge eutectic bonding process to form electrical connection between pads on the substrate and pads on the MEMS substrate as well as a hermetically sealed cavity. In the described embodiments, the device can be any MEMS device with a moveable structure such as but not limited to accelerometer, gyroscope, magnetic sensors, barometers, pressure sensors, microphones speakers and resonators. In the described embodiments, the substrate can include electronic circuits for sensing and processing the motion of the MEMS device, without limitation. One skilled in the art would appreciate that the substrate can be substituted with any type of substrate such as a CMOS wafer, ceramic substrate or a silicon substrate or other semiconductor substrate.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the words preferable, preferably, or preferred in the description above indicates that the feature so described may be more desirable, it nonetheless may not be necessary and embodiments lacking the same may be contemplated as within the scope of the invention, that scope being defined by the claims that follow.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

The invention claimed is:

1. A MEMS device comprising:
   a MEMS structure;
   a substrate coupled to the MEMS structure, the substrate comprising a layer of metal and a layer of dielectric material; wherein the MEMS structure moves relative to the substrate in response to an excitation;
   a first over-travel stop is formed on the substrate at a first distance from the MEMS structure;
   a second over-travel stop on the substrate at a second distance from the MEMS structure; and
   at least one electrode on the substrate at a third distance from the MEMS structure;
   wherein the first, second and third distances are all different.

2. The MEMS device of claim 1, wherein the substrate comprises a plurality of layers, wherein the plurality of layers comprises a plurality of interleaved metal layers and interlayer dielectric layers (ILDs).

3. The MEMS device of claim 2, wherein the substrate further comprises a transistor layer.

4. The MEMS device of claim 2, wherein one of the first over-travel stop and the second over-travel stop is an array of tungsten plugs.

5. The MEMS device of claim 2, wherein one of the first over-travel stop and the second over-travel stop is formed on a flexible element.

6. The MEMS device of claim 5, wherein the flexible element is constructed from the metal layers of the substrate.

7. The MEMS device of claim 1, wherein one of the first over-travel stop and the second over-travel stop is a conductive material.

8. The MEMS device of claim 7, wherein the conductive material comprises aluminum, copper, silicon, tungsten, germanium or titanium nitride.

9. The MEMS device of claim 1, wherein one of the first over-travel stop and the second over-travel stop is a non-conductive material.

10. The MEMS device of claim 9, wherein the non-conductive material comprises silicon nitride or silicon oxide.

11. The MEMS device of claim 1, wherein one of the first over-travel stop and the second over-travel stop is a block of tungsten.

12. The MEMS device of claim 1, wherein the excitation is an acceleration, angular velocity, magnetic field, sound, pressure or electrostatic force.

13. A method for fabricating a MEMS device comprising:
   providing a MEMS structure;
   providing a substrate; wherein the substrate comprises dielectric and patterned conductive material; and
   removing portions of the dielectric to provide at least two over-travel stops and at least one electrode within the substrate;
   further bonding the MEMS structure to the substrate;

wherein the at least two over-travel stops and the at least one electrode have different distances between the MEMS structure and the substrate.

14. The method of claim 13, wherein one of a timed dry etch or a timed wet etch is used to remove the dielectric.

* * * * *